United States Patent
Choi et al.

(10) Patent No.: US 8,158,996 B2
(45) Date of Patent: Apr. 17, 2012

(54) SEMICONDUCTOR LIGHT EMITTING DEVICE PACKAGE

(75) Inventors: Yong Seok Choi, Gwangju (KR); Kwang Cheol Lee, Buk-gu (KR)

(73) Assignee: LG Innotek Co., Ltd., Seoul (KR)

( * ) Notice: Subject to any disclaimer, the term of this patent is extended or adjusted under 35 U.S.C. 154(b) by 240 days.

(21) Appl. No.: 12/443,659

(22) PCT Filed: Dec. 18, 2007

(86) PCT No.: PCT/KR2007/006625
§ 371 (c)(1),
(2), (4) Date: Mar. 30, 2009

(87) PCT Pub. No.: WO2008/078900
PCT Pub. Date: Jul. 3, 2008

(65) Prior Publication Data
US 2010/0012967 A1    Jan. 21, 2010

(30) Foreign Application Priority Data
Dec. 27, 2006 (KR) .................. 10-2006-0134414

(51) Int. Cl.
*H01L 33/00* (2010.01)
(52) U.S. Cl. ..... 257/98; 257/99; 257/100; 257/E33.059; 257/E33.072; 257/E33.075
(58) Field of Classification Search ............ 257/98, 257/99, 100, E33.059, E33.072, E33.075
See application file for complete search history.

(56) References Cited

U.S. PATENT DOCUMENTS

| | | | |
|---|---|---|---|
| 7,479,733 B2 * | 1/2009 | Chang et al. ............... | 313/503 |
| 7,592,638 B2 * | 9/2009 | Kim ............................ | 257/98 |
| 2003/0067264 A1 | 4/2003 | Takekuma | |
| 2005/0023548 A1 * | 2/2005 | Bhat et al. ................. | 257/99 |
| 2005/0051789 A1 | 3/2005 | Negley et al. | |
| 2005/0184387 A1 | 8/2005 | Collins, III et al. | |
| 2007/0010157 A1 * | 1/2007 | Sorg ........................... | 445/25 |
| 2008/0017962 A1 | 1/2008 | Lin | |
| 2009/0273005 A1 * | 11/2009 | Lin ............................ | 257/99 |

FOREIGN PATENT DOCUMENTS

| | | |
|---|---|---|
| JP | 2003-131084 A | 5/2003 |
| JP | 2004-22588 A | 1/2004 |
| JP | 2005-303071 A | 10/2005 |
| KR | 2000-0045980 A | 7/2000 |

* cited by examiner

*Primary Examiner* — Minh-Loan T Tran
(74) *Attorney, Agent, or Firm* — Birch, Stewart, Kolasch & Birch, LLP

(57) ABSTRACT

A semiconductor light emitting device package according to an embodiment comprising: a package body comprising a groove section; an electrode in the groove section; at least one semiconductor light emitting device electrically connected to the electrode in the groove section of the package body; an interconnection pattern on an outer peripheral surface of the package body and electrically connected to the electrode, wherein a part of the interconnection pattern is on a bottom surface of the package body; and a metal pattern is on the bottom surface of the package body corresponding to an area in which the semiconductor light emitting device is located.

14 Claims, 2 Drawing Sheets

[Fig. 1]
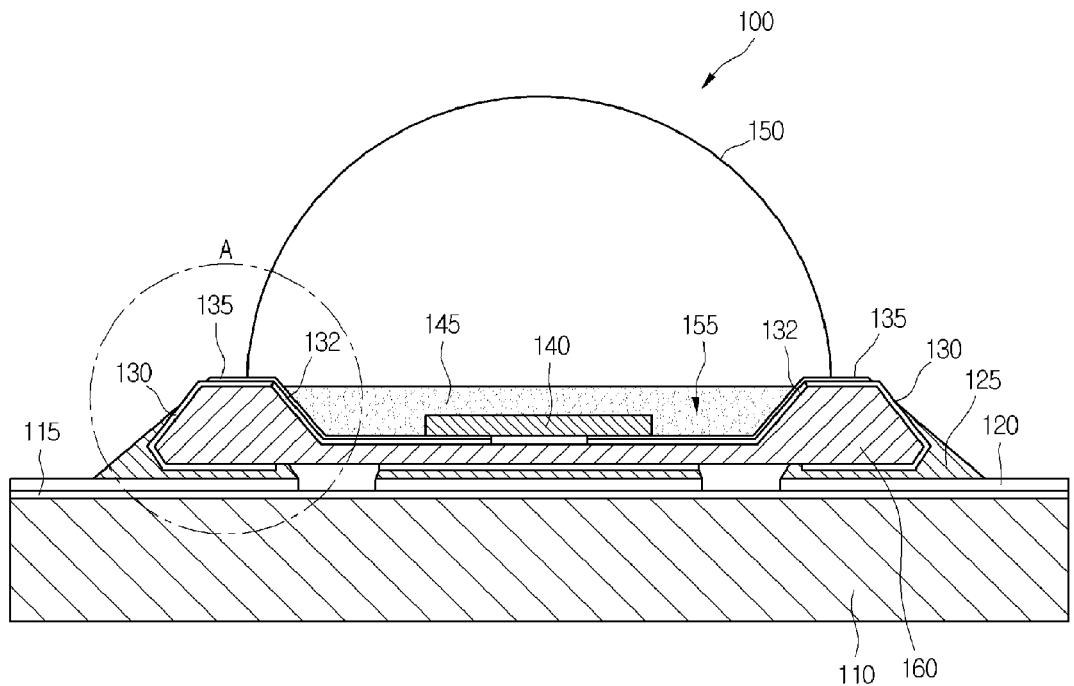
[Fig. 2]
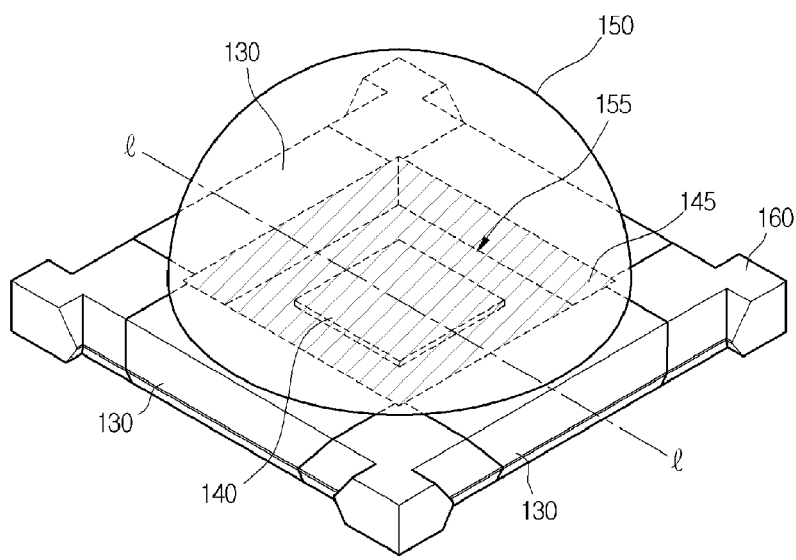

[Fig. 3]
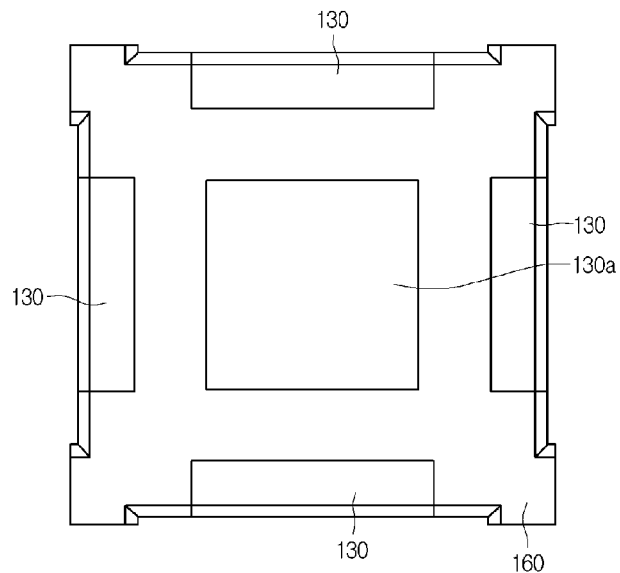
[Fig. 4]
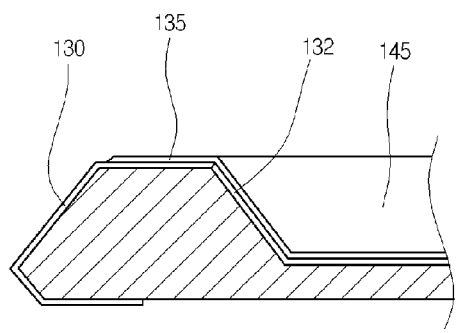
[Fig. 5]
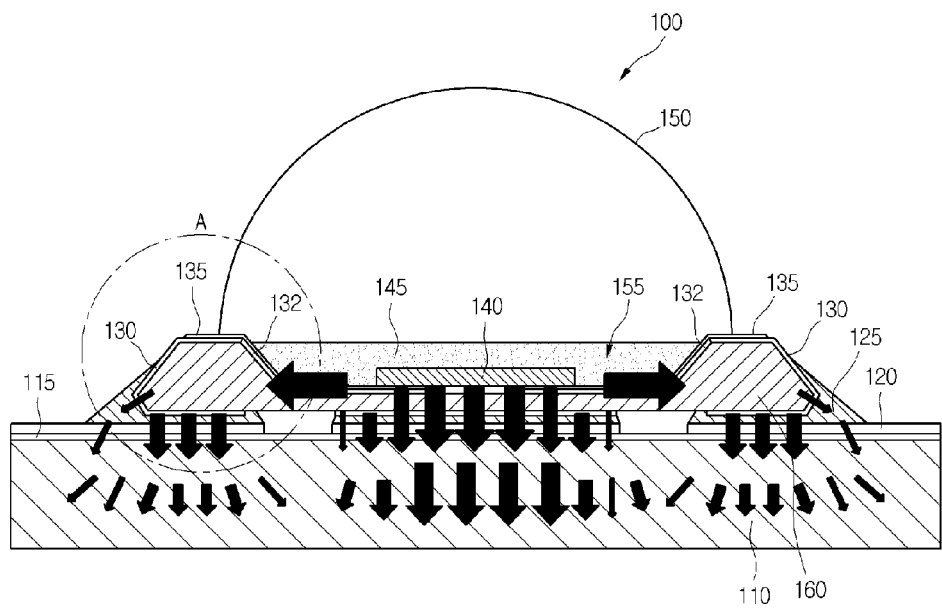

SEMICONDUCTOR LIGHT EMITTING DEVICE PACKAGE

TECHNICAL FIELD

The embodiment relates to a semiconductor light emitting device package.

BACKGROUND ART

A semiconductor light emitting device package comprises an LED light emitting diode), an LD (laser diode) and the like. A semiconductor light emitting device is used to convert electrical signals into infrared rays, visible rays and the like by using the characteristics of a compound semiconductor and to exchange the converted signals In general, an LED has been widely used for household electrical appliances, remote controllers, electric light boards, indicators, and various automation devices, and is largely clarified as an IRED (infrared emitting diode) and a VLED (visible light emitting diode).

In general, an LED having a small size is fabricated in the form of a surface mount device so that the LED is directly mounted on a PCB (printed circuit board). Accordingly, an LED lamp used as a display device is also fabricated in the form of a surface mount device. Such a surface mount device can replace an existing simple lighting lamp and is used as a lighting indicator producing various colors, a character indicator, an image indicator and the like.

As described above, such a semiconductor light emitting device package has been used for various fields, for example, electric lights for daily life, electric lights for outputting rescue signals and the like. Further, demand for a high-brightness semiconductor light emitting device has increased more and more. Thus, a high-power light emitting device package capable of improving the heat dissipation and light emitting efficiency has been actively developed.

DISCLOSURE OF INVENTION

Technical Problem

The embodiment provides a semiconductor light emitting device package capable of improving the heat dissipation and light emitting efficiency by forming a single package using at least one high-power semiconductor light emitting device.

Technical Solution

A semiconductor light emitting device package according to an embodiment comprising: a package body comprising a groove section; an electrode in the groove section; at least one semiconductor light emitting device electrically connected to the electrode in the groove section of the package body; an interconnection pattern on an outer peripheral surface of the package body and electrically connected to the electrode, wherein a part of the interconnection pattern is on a bottom surface of the package body; and a metal pattern is on the bottom surface of the package body corresponding to an area in which the semiconductor light emitting device is located.

A semiconductor light emitting device package according to an embodiment comprising: a heat conductive package body comprising a groove section; a electrode in the groove section; at least one semiconductor light emitting device electrically connected to the electrode in the groove section of the package body; an interconnection pattern on an outer peripheral surface of the package body and electrically connected to the electrode; a substrate supporting the package body; and a land pattern on the substrate.

Advantageous Effects

According to the semiconductor light emitting device of the embodiment, heat radiating and light emitting efficiency is improved, so that a high brightness and high heating type semiconductor light emitting device, such as a light emitting device for illumination, can be easily prepared in the form of a single package regardless of the number of semiconductor light emitting devices.

According to the embodiment, the structure of the electrodes (comprising the interconnection pattern) is improved, so that heat dissipation can be easily performed, and a circuit construction of a plurality of semiconductor light emitting devices can be simplified.

According to the embodiment, the molding area having a superior optical function and the molding area having a superior protective function are individually formed, and are differentially molded by forming the groove section, so that the two molding areas can be firmly manufactured and the optical characteristics can be improved.

BRIEF DESCRIPTION OF THE DRAWINGS

FIG. 1 is a side sectional view showing the structure of a semiconductor light emitting device package according to an embodiment;

FIG. 2 is a perspective view schematically showing the structure of a semiconductor light emitting device package according to an embodiment;

FIG. 3 is a bottom view schematically showing the structure of a semiconductor light emitting device package according to an embodiment;

FIG. 4 is a side sectional view showing a part of a package body constituting a semiconductor light emitting device package according to an embodiment; and FIG. 5 is a side sectional view showing paths through which heat is radiated on a semiconductor light emitting device package according to an embodiment.

MODE FOR THE INVENTION

In the description of an embodiment, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present.

Hereinafter, an embodiment will be described with reference to the accompanying drawings.

FIG. 1 is a side sectional view showing a semiconductor light emitting device package according to an embodiment.

As shown in FIG. 1, the semiconductor light emitting device package 100 according to the embodiment comprises a substrate 110, an insulator 115, a land pattern 120, a solder part 125, an interconnection pattern 130, an electrode 132, a reflective layer 135, a semiconductor light emitting device 140, a first molding part 145, a second molding part 150 and a package body 160.

The semiconductor light emitting device package 100 according to the embodiment achieves the high light efficiency and high heat radiating (heat conductive) efficiency as a light emitting device package for illumination.

The semiconductor light emitting device package 100 according to the embodiment may be divided into a first structure based on the package body 160 and a second structure based on the substrate 110.

The semiconductor light emitting device package 100 according to the embodiment may also comprise only the first structure or a combination of the first structure and the second structure.

The first structure comprises the package body 160, the interconnection pattern 130, the electrode 132, the reflective layer 135, the semiconductor light emitting device 140, the first molding part 145 and the second molding part 150. The second structure comprises the substrate 110, the insulator 115, the land pattern 120 and the solder part 125. The land pattern 120, for example, denotes an electrode pad formed for contact with an external device on a PCB (printed circuit board).

According to the embodiment, processes of mounting the first structure including the package body 160 on the substrate 110, and cutting and breaking the substrate 110 are performed, so that the semiconductor light emitting device package having a combination structure of the first structure and the second structure can be manufactured.

Hereinafter, the construction and operation of the semiconductor light emitting device package according to the embodiment will be described with reference to the accompanying drawings.

FIG. 2 is a perspective view schematically showing the structure of the semiconductor light emitting device package according to the embodiment, and FIG. 1 is a side sectional view showing the section 1-1 of the semiconductor light emitting device package shown in FIG. 2.

Referring to FIGS. 1 and 2, the package body 160 serves as a housing, and has a groove section 155 at the central portion thereof. The semiconductor light emitting device 140 is located in the groove section 155.

The package body 160 may be formed of materials (or combinations of materials) having superior insulating properties and heat conductivity such as silicon, SiC (silicon carbide), AlN (aluminum nitride) and the like. Preferably, the package body 160 may be subject to surface treating by using SiOx (silicon oxide) or SiNx (silicon nitride) under the conditions in which the electrical conductivity is $10^{10}$ Ω/cm or more and the heat conductivity is 140 W/mK or more.

The package body 160 has a hexahedral shape including four sides inclined in upward and downward directions When the package body 160 comprises silicon, each side has an inclination angle of about 109° e.g. 107° to 111°.

As the sides of the package body 160 are inclined as described above, when the solder part 125 is formed by soldering or reflowing, the solder part 125 can be coated on parts of the sides and upper surfaces of the package body 160. Thus, an additional heat dissipation path can be formed through the solder part 125 together with the interconnection pattern 130. Simultaneously, the package body 160 is drawn toward the substrate 110 to form a short heat dissipation path, so that heat dissipation can be easily achieved.

The groove section 155 is etched in a rectangular shape similarly to the shape of the package body 160, and four sides thereof are inclined from the top to the bottom (i.e. the groove section 155 can be prepared in the form of a truncated square pyramid shape).

The reason for upwardly inclining the sides of the groove section 155 is to emit light in the upward direction by reflecting the light generated from the semiconductor light emitting device 140 (the reflective layer 135 is located at the groove section 155). The reflective layer 135 comprises material, such as silver, aluminum and the like, which has a reflectivity of 90% or more within the range of a visible ray.

When the side of the groove section 155 comprises silicon, an inclination angle between the side and the bottom surface thereof is about 125° i.e. 123° to 127°. This denotes an angle formed when the crystal surface <100> of semiconductor silicon is etched.

The groove section 155 has a depth relatively shorter than the length and width thereof, and the length may have the same numerical value as that of the width. For example, the groove section 155 may have a depth corresponding to at least ½ of the length of the package body 160. The depth is 150 μm or more.

Meanwhile, the electrodes 132 are formed at the inner surface of the groove section 155 to be electrically connected to the semiconductor light emitting device 140. Further, the electrodes 132 are connected to the interconnection pattern 130 at the outer portion of the groove section 155. The interconnection pattern 130 extends along the upper and bottom surfaces of the package body 160 to be electrically connected to the land pattern 120 of the substrate 110.

The electrode 132 comprises the same conductive material as that of the interconnection pattern 130. The electrode 132 and the interconnection pattern 130 may be provided as a single structure or may be separated from each other. The electrode 132 and the interconnection pattern 130 have sufficient thickness in consideration of the amount of electric current and current density applied thereto.

The interconnection pattern 130 is curved several times from the upper surface of the package body 160, except for the groove section 155, to the bottom surface of the package body 160 along the outer surface of the package body 160. The interconnection pattern 130 formed along the upper and outer surfaces of the package body 160 serves as an electrical path and radiates heat, which is transferred to the package body 160, to an exterior of the package body 160.

Further, the interconnection pattern 130 formed along the bottom surface of the package body 160 is electrically connected to the land pattern 120 of the substrate 110 through the solder part 125. The interconnection pattern 130 can physically adhere to the substrate 110.

The interconnection pattern 130 may have the same curved structure on the four sides of the package body 160. At this time, it is advantageous in terms of heat dissipation if the interconnection pattern 130 and the electrode 132 are designed to have a large area on the package body 160.

The electrodes 132 may be individually formed on the bottom surface and the four sides in the groove section 155.

FIG. 3 is a bottom view schematically showing the structure of the semiconductor light emitting device package according to the embodiment.

FIG. 3 shows the bottom surface of the package body 160 other than the bottom surface of the substrate 110. Referring to FIG. 3, the interconnection pattern 130 extends up to the bottom surface of the package body 160 while being curved along the four sides of the package body 160. Further, a metal pattern 130a is formed at the lower center portion of the package body 160.

The metal pattern 130a is located corresponding to the groove section 155 to which the semiconductor light emitting device 140 is disposed, and can be connected to the land pattern 120 of the substrate 110 through the solder part 125.

The metal pattern 130a connected to the land pattern 120 of the substrate 110 transmits the heat of the package body 160 to the substrate 110 through the shortest path to maximize the heat dissipation.

FIGS. 2 and 3 shows a case in which a single semiconductor light emitting device (chip type) is provided. However, a plurality of semiconductor light emitting devices may also be provided to be connected to the electrodes 132, respectively. The semiconductor light emitting device according to the embodiment can be coupled to the electrodes 132 through flip chip bonding or wire bonding.

The semiconductor light emitting device 140 may comprise III-V group compound such as GaN, AlN, InN, GaAs and the like.

The substrate 110 comprises heat conductive material such as aluminum or copper, and radiates the heat, which is transferred from the interconnection pattern 130, to the lower portion of the substrate 110. The land pattern 120 formed on the surface of the substrate 110 is connected to the interconnection pattern 130 through the solder part 125.

That is, the substrate 110 and the package body 160 can be physically fixed to each other through the solder part 125.

The insulator 115 is formed between the substrate 110 and the land pattern 120, so that the land pattern 120 can be electrically insulated from the substrate 110.

FIG. 4 is a side sectional view showing a part of the package body constituting the semiconductor light emitting device package according to the embodiment. FIG. 4 is an enlarged view of "A" shown in FIG. 1 when the semiconductor light emitting device package according to the embodiment is manufactured.

As shown in FIGS. 1 and 4, the reflective layer 135 is formed on the electrodes 132 in the groove section 155 to reflect the light, which is emitted from the semiconductor light emitting device 140, in the upward direction toward the semiconductor light emitting device 140. Further, the reflective layer 135 may be formed on a part of the upper surface of the package body 160, except for the groove section 155, corresponding to the area in which the second molding part 150 is formed.

Referring to FIG. 1, the interconnection pattern 130, the electrodes 132 and the reflective layer 135, which comprise metal, and the first molding part 145 comprising transmissive resin is disposed on the package body 160 comprising silicon.

The first molding part 145 is formed in the groove section 155 and is provided as light transmissive protective resin. For example, the first molding part 145 can seal the groove section 155 by using silicon or epoxy comprising fluorescent material.

The reference light generated from the semiconductor light emitting device 140 is emitted in the upward direction.

In the vicinity of the surface of the semiconductor light emitting device 140, the reference light is absorbed in the fluorescent material of the first molding part 145 and then is re-emitted as excited light (that is, excited secondary light). Thus, a white color may be displayed due to mixture of the excited light and the reference light.

In such a case, since color variation and difference of uniformity occur according to the shape of the first molding part 145 comprising the fluorescent material, the first molding part 145 preferably has a flat shape with respect to the opened surface of the groove section 155.

As described above, the first molding part 145 is thinly formed on the semiconductor light emitting device 140 without extending out of the groove section 155, so that a light path of the emitting light and reflecting light from the semiconductor light emitting device 140 to the first molding part 145 can be uniformly formed.

The first molding part 145 primarily seals the groove section 155 and the second molding part 150 secondarily seals the groove section 155. At this time, the second molding part 150 has a dome shape. When the light generated from the semiconductor light emitting device 140 is emitted to the air, a proper interfacial angle is set between the second molding part 150 and the air such that the light can be efficiently emitted from the interface between the second molding part 150 and the air without total reflection. Further, the second molding part 150 guides an optical path such that the light can be uniformly emitted in an upward direction.

Further, the semiconductor light emitting device package 100 according to the embodiment may comprise an ESD protective device, such as a Schottky diode or a Zener diode, in order to protect the semiconductor light emitting device 140 when an ESD (electrostatic discharge) phenomenon or over-voltage occurs.

The ESD protective device may be formed at the package body 160. According to one example, the ESD protective device may be located on the upper surface of the package body 160, in which the groove section is not formed, instead of the groove section. At this time, the ESD protective device can be prepared in the form of a protective circuit, which is electrically connected to the interconnection pattern 130 and the electrodes 132, which are formed along the package body 160, in parallel to the semiconductor light emitting device 140 to protect the semiconductor light emitting device 140.

FIG. 5 is a side sectional view showing paths through which heat is radiated on the semiconductor light emitting device package according to the embodiment.

Referring to FIG. 5, the heat radiated from the semiconductor light emitting device 140 is transferred to the substrate 110 through the paths via the electrodes 132, the interconnection pattern 130, the solder part 125 and the land pattern 120. Accordingly, the heat transfer paths are expanded, so that a light emitting device emitting a large amount of heat, such as a semiconductor light emitting device for illumination, can efficiently dissipate heat.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawing; and the appended claims. In addition to variations and modifications in the component parts and/or arrangements, alternative uses will also be apparent to those skilled in the art.

Industrial Applicability

According to the semiconductor light emitting device of the embodiment, heat radiating and light emitting efficiency is improved, so that a high brightness and high heating type semiconductor light emitting device, such as a light emitting device for illumination, can be easily prepared in the form of a single package regardless of the number of semiconductor light emitting devices.

According to the embodiment, the structure of the electrodes (comprising the interconnection pattern) is improved, so that heat dissipation can be easily performed, and a circuit construction of a plurality of semiconductor light emitting devices can be simplified According to the embodiment, the molding area having a superior optical function and the molding area having a superior protective function are individually formed, and are differentially molded by forming the groove section, so that the two molding areas can be firmly manufactured and the optical characteristics can be improved.

The invention claimed is:

1. A semiconductor light emitting device package comprising:
   a main body including a supporting member and a reflecting member on the supporting member;
   at least one semiconductor light emitting device disposed on the supporting member in which the reflecting member surrounds the at least one semiconductor light emitting device;
   first and second electrodes on the supporting member, at least one electrode of the first and second electrodes partially extending under the at least one semiconductor light emitting device;
   a metal pattern disposed on a bottom surface of the supporting member at a position corresponding to the at least one semiconductor light emitting device and extending beyond outside edges of the at least one semiconductor light emitting device; and
   a reflective layer disposed on the first and second electrodes;
   wherein the at least one semiconductor light emitting device is in contact with the reflective layer,
   wherein the first and second electrodes also extend underneath a bottom surface of the supporting member, and
   wherein the first and second electrodes are separated from the metal pattern at the bottom surface of the supporting member.

2. The semiconductor light emitting device package of claim 1, wherein the first and second electrodes extend from an upper surface of the supporting member on outside surfaces of the supporting member to the bottom surface of the supporting member.

3. The semiconductor light emitting device package of claim 1, further comprising:
   a solder material on outside edges of the main body to connect the main body to a substrate.

4. The semiconductor light emitting device package of claim 1, wherein the supporting member and the reflecting member are made of the same material.

5. The semiconductor light emitting device package of claim 1, wherein at least one of the first and second electrodes partially surrounds the at least one semiconductor light emitting device.

6. The semiconductor light emitting device package of claim 1, wherein at least one of the first and second electrodes is on an upper surface of the reflecting member.

7. The semiconductor light emitting device package of claim 1, wherein the reflecting member includes an angled portion.

8. The semiconductor light emitting device package of claim 1, wherein the reflecting member includes a conductive material.

9. The semiconductor light emitting device package of claim 1, further comprising:
   a first molding part surrounded by the reflecting member and covering the at least one semiconductor light emitting device; and
   a second molding part disposed on the first molding part, the second molding part formed in a domed shape.

10. The semiconductor light emitting device package of claim 9, wherein the second molding part includes a lens.

11. The semiconductor light emitting device package of claim 10, wherein the lens has a hemispherical shape.

12. The semiconductor light emitting device package of claim 1, wherein the reflective layer comprises silver or aluminum.

13. The semiconductor light emitting device package of claim 1, wherein the reflective layer is formed on an upper surface of the reflecting member.

14. The semiconductor light emitting device package of claim 1, wherein the reflecting member has an inner surface defining a cavity and an outer surface extending from the inner surface, and
   wherein the first and second electrodes extend from the at least one semiconductor light emitting device, up the inner surface of the reflecting member and down the outer surface before extending to the bottom surface of the supporting member.

* * * * *